(12) United States Patent
Li et al.

(10) Patent No.: US 10,290,432 B1
(45) Date of Patent: May 14, 2019

(54) METHOD FOR FORMING PEROVSKITE SOLAR CELL WITH PRINTABLE CARBON ELECTRODE

(71) Applicant: Nano and Advanced Materials Institute Limited, Hong Kong (HK)

(72) Inventors: Qian Li, Hong Kong (HK); Chao Cai, Hong Kong (HK); Qingdan Yang, Hong Kong (HK); Jia Li, Hong Kong (HK); Paul Kwok Keung Ho, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 0 days.

(21) Appl. No.: 15/894,990

(22) Filed: Feb. 13, 2018

(51) Int. Cl.
*H01L 51/50* (2006.01)
*H01G 9/20* (2006.01)
(Continued)

(52) U.S. Cl.
CPC .............. *H01G 9/2022* (2013.01); *C09D 7/67* (2018.01); *C09D 7/68* (2018.01); *C09D 11/037* (2013.01); *C09D 11/102* (2013.01); *C09D 11/52* (2013.01); *H01G 9/0029* (2013.01); *H01G 9/2009* (2013.01); *H01G 9/2031* (2013.01); *H01L 51/0022* (2013.01); *H01L 51/0048* (2013.01); *H01L 51/4226* (2013.01); *C08K 3/04* (2013.01);
(Continued)

(58) Field of Classification Search
CPC .. H01G 9/2022; H01G 9/2009; H01G 9/2031; H01G 9/0029; C09D 7/68; C09D 11/52; C09D 11/037; C09D 7/67; C09D 11/102; H01L 51/4226; H01L 51/0022; H01L 51/0048; H01L 51/0077; H01L 2201/00; C08K 3/04; C08K 3/041; C08K 3/042; C08K 3/046; C08K 2201/005; C08K 2201/001; G06F 21/6218; G06F 16/9027; G06F 16/278; G06F 16/22; G06F 21/6263; G06F 21/6227; G06F 21/57; G06F 2221/2123; H04L 63/0428; H04L 63/102
See application file for complete search history.

(56) References Cited

U.S. PATENT DOCUMENTS 10,020,516 B2 *   7/2018   Lockett ................... H01M 4/06
2012/0299470 A1 *  11/2012   Kobayashi ............. E06B 9/386
                                                         313/504
(Continued)

*Primary Examiner* — Thanh T Nguyen
(74) *Attorney, Agent, or Firm* — Spruson & Ferguson (Hong Kong) Limited

(57) ABSTRACT

To fabricate a perovskite solar cell (PSC), a printable carbon electrode is formed on an uppermost layer, either a perovskite layer or an interface layer thereon, of a partially-completed PSC. A carbon ink is first prepared by dispersing carbon materials in a mixture of a polymer binder and a solvent. Then the carbon ink is screen-printed on the uppermost layer to form a wet film thereon. The wet film is baked with a baking temperature not exceeding 100° C. to evaporate the solvent to form the carbon electrode. Advantageously, the wet film is pressed with a pressure during baking such that the carbon electrode becomes denser and yields a lower sheet resistance when compared to one formed without being pressed. Preferably the pressure is at least 16,000 Pa. Experimental results show that the percentage reduction of sheet resistance can reach 40%.

20 Claims, 4 Drawing Sheets

(51) Int. Cl.
    *H01L 51/42* (2006.01)
    *H01L 51/00* (2006.01)
    *C09D 11/102* (2014.01)
    *C09D 7/40* (2018.01)
    *C09D 11/037* (2014.01)
    *C09D 11/52* (2014.01)
    *H01G 9/00* (2006.01)
    *C08K 3/04* (2006.01)

(52) U.S. Cl.
    CPC .............. *C08K 3/041* (2017.05); *C08K 3/042* (2017.05); *C08K 3/046* (2017.05); *C08K 2201/001* (2013.01); *C08K 2201/005* (2013.01); *H01L 51/0077* (2013.01)

(56) References Cited

U.S. PATENT DOCUMENTS

| | | | | |
|---|---|---|---|---|
| 2015/0249214 | A1* | 9/2015 | Watanabe | H01L 51/42 136/263 |
| 2016/0272656 | A1* | 9/2016 | Cho | C07D 487/04 |
| 2017/0346031 | A1* | 11/2017 | Lee | C09K 11/06 |

* cited by examiner

METHOD FOR FORMING PEROVSKITE SOLAR CELL WITH PRINTABLE CARBON ELECTRODE

FIELD OF THE INVENTION

The present invention relates to a method for forming a perovskite solar cell (PSC) with a printable carbon electrode on a perovskite layer.

BACKGROUND

A PSC has a high efficiency in power conversion and a potential to achieve a low production cost, thus making the PSC a promising candidate as an energy harvester for sustainable energy source. Recent efforts of improving the PSC for commercialization include improving the power conversion efficiency (PCE), the scalability and manufacturability of the process as well. One problem is that in forming a top electrode on top of a perovskite layer of the solar cell, the top electrode is usually fabricated by a vacuum-based process, which is energy-consuming and costly. Developing printable electrode materials for the PSC using a solution-based process is therefore highly desirable.

There have been attempts to develop a carbon electrode formed by a conductive ink comprising, for example, metal oxide and graphite particles. The conductive ink can penetrate into the methylamine lead iodine mixed with zirconium dioxide as present in the perovskite layer to form the carbon electrode. However, this method involves high temperature annealing at 400-500° C. This high temperature annealing may result in a high cost and a long processing time in device fabrication. It may also affect the device performance.

Apart from directly mixing a carbon paste with the methylamine lead iodine, there have also been attempts of directly printing the conductive ink onto an interface layer of the cell. In this approach, the carbon electrode is formed after low-temperature annealing of the conductive ink (around 100° C., as disclosed by Kumar, M. H., et al. in "Flexible, low-temperature, solution processed ZnO-based perovskite solid state solar cells," *Chemical Communications*, 2013, 49, pp. 11089-11091). Using the low temperature annealing is beneficiary for reducing the production cost. However, the solar cell fabricated using this low-temperature annealing approach results in a PCE that is relatively low (5%).

There is a need in the art for a technique of making a PSC with a carbon electrode formed based on printing and low-temperature annealing while improving the PCE of the solar cell.

SUMMARY OF THE INVENTION

The present invention provides a method for fabricating a PSC. The method comprises forming a carbon electrode on an uppermost layer of a partially-completed PSC. The uppermost layer is either a perovskite layer or an interface layer deposited thereon. In forming the carbon electrode, a conductive carbon ink is first obtained or prepared. The carbon ink comprises plural carbon materials, a polymer binder and a solvent. The carbon materials are dispersed in a mixture of the polymer binder and the solvent. The polymer binder is used for connecting the carbon materials together to from the carbon ink. The carbon ink is then screen-printed on the uppermost layer to form a wet film thereon. The wet film is baked with a baking temperature to evaporate the solvent therein to thereby form the carbon electrode. The baking temperature may be selected to be not greater than 100° C. Alternatively, the baking temperature may be selected to be not greater than a maximum temperature incurred in fabricating the perovskite layer. During baking, advantageously the wet film is pressed with a pressure such that the carbon electrode that is formed becomes denser and yields a lower sheet resistance when compared to a second carbon electrode formed without being pressed.

Preferably, the pressure is at least 16,000 Pa. Also preferably, the pressure is selected from 16,000 Pa to 1,600,000 Pa, or from 160,000 Pa to 1,600,000 Pa.

The baking temperature may be selected from 30° C. to 100° C.

The carbon materials used in forming the carbon ink may include one or more of graphite, graphene, carbon fibers and carbon nanotubes.

Preferably, one of the carbon materials is carbon black. The carbon black is regarded as a filler while remaining one or more carbon materials are collectively regarded as a host material. The carbon black preferably has a particle size in a range of 2 nm to 200 nm. A weight ratio of the host material to the filler may be selected from 1 to 10.

A total weight of the carbon materials in the ink may be 10% to 90% of a weight of the ink.

Preferably, the solvent is formed by mixing plural component solvents having different boiling points. At least one of the component solvents may be selected from DBE-4 dibasic ester, DBE-5 dibasic ester and DBE-6 dibasic ester.

The polymer binder may be composed of one or more of polyurethane, ethyl cellulose, polyamide and polyvinyl butyral. A weight ratio of the polymer binder in the ink may be selected from 10% to 40%.

Optionally, the carbon ink further comprises metal particles dispersed in the mixture for further reducing the carbon electrode's sheet resistance.

The method may further comprise forming the perovskite layer on a mesoporous TiO$_2$ layer of the partially-completed PSC. The perovskite layer may be formed by a one-step or two-step spin-coating process, or via spray coating or dip coating.

Other aspects of the present invention are disclosed as illustrated by the embodiments hereinafter.

DETAILED DESCRIPTION

The present invention provides a technique for fabricating a PSC with a printable carbon electrode. Particularly, the present invention details a method for forming the carbon electrode on a perovskite layer or an interface layer of the solar cell without using high-temperature annealing at a temperature of 400-500° C. The interface layer is an optional layer above the perovskite layer for improving the PCE. Specifically, an embodiment of the present invention allows a baking temperature of only 100° C. or lower. Furthermore, the carbon electrode is deposited onto the perovskite layer or the interface layer via printing a conductive carbon ink on the perovskite layer or the interface layer. The use of both printing and low-temperature treatment keeps a low manufacturing cost. Furthermore, the disclosed method is developed with another major objective of pushing up the PCE, through an advantageous use of a hot press treatment in forming the carbon electrode.

The focus of the present invention is on the method for forming the carbon electrode on the perovskite layer or the interface layer. This method is applied to a partially-completed PSC having an uppermost layer, which is either a perovskite layer or an interface layer, and other functional layers underneath the uppermost layer. Examples of these other functional layers include a transparent conductive electrode and a glass substrate. The present invention is not limited to any particular structure of the partially-completed PSC, provided that the partially-completed PSC has a perovskite layer or an interface layer as the uppermost layer having one surface uncovered, namely, open to an ambient environment. Different structures of the partially-completed PSCs may be obtained according to, for example, CN105895804, CN105609640 and CN105336862.

An aspect of the present invention is to provide a method for fabricating a PSC. This fabricating method comprises a method for forming a carbon electrode on a perovskite layer or an interface layer in the PSC.

The fabricating method is exemplarily illustrated by reference to a representative PSC shown in FIG. 1, which depicts a layered structure of a printable mesoporous PSC 100.

Figure 1:
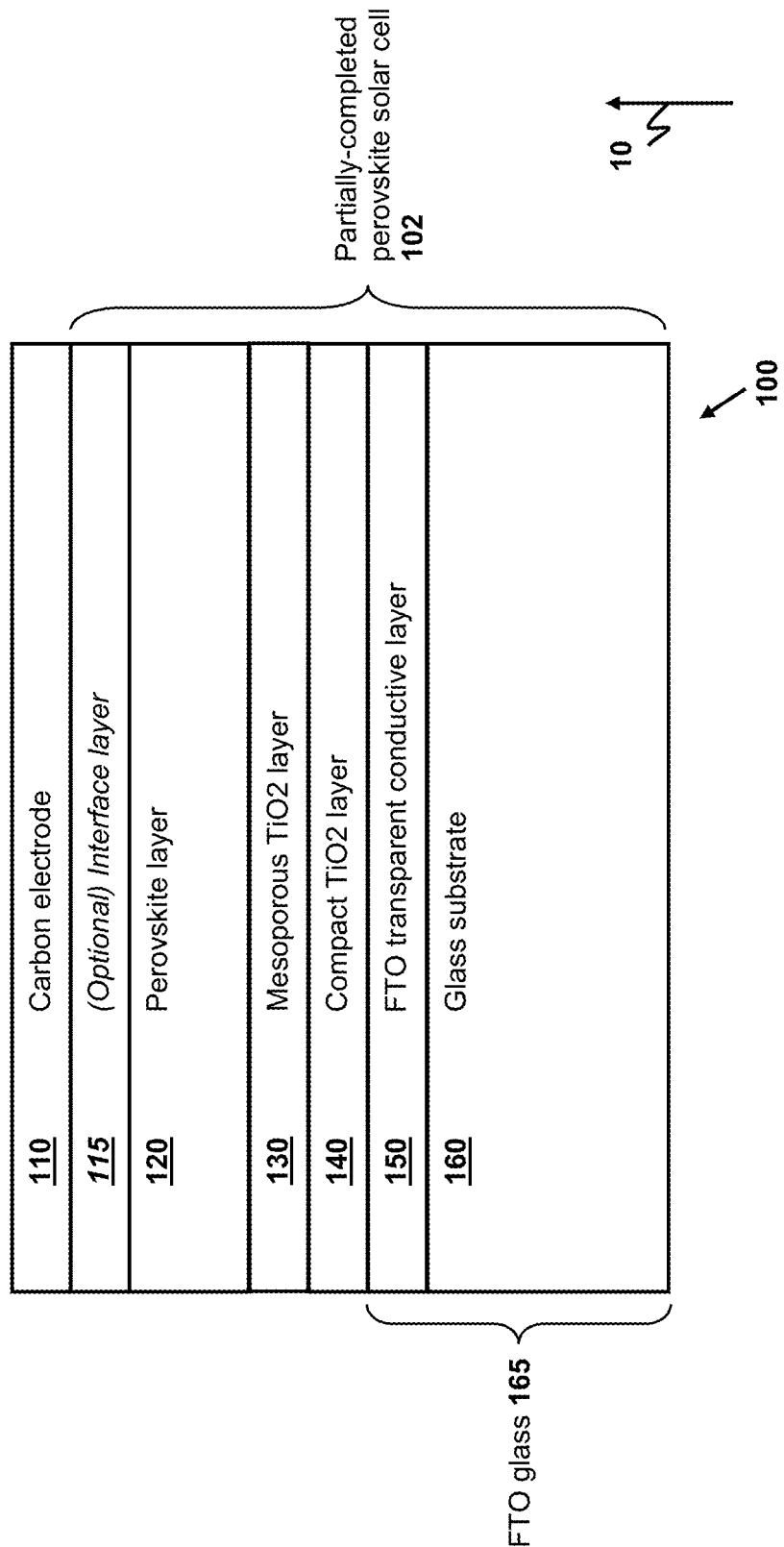
FIG. 1 is a schematic drawing of a structure of a printable mesoporous PSC, this structure being used as a representative example for illustrating a method used for fabricating the PSC and in particular, a method for forming a carbon electrode on a perovskite layer or an interface layer as disclosed in the present invention.

In FIG. 1, a reference vertical direction 10 is defined. Herein in the specification and appended claims, positional and directional words such as "above," "below," "higher," "upper," "uppermost," "lower," "lowest," "top," "bottom" and "horizontal" are interpreted with reference to the reference vertical direction 10.

The PSC 100 comprises a glass substrate 160 for providing mechanical support to the rest of the PSC 100. A fluorine doped tin oxide (FTO) transparent conductive layer 150 is formed on the glass substrate 160. On top of the FTO transparent conductive layer 150 there is a compact $TiO_2$ (titanium dioxide) layer 140, which is overlaid by a mesoporous $TiO_2$ layer 130. A perovskite layer 120 is developed on the mesoporous $TiO_2$ layer 130. Optionally, the perovskite layer 120 is deposited with an interface layer 115 for improving the PCE. The perovskite layer 120, or the interface layer 115 if present, is covered by a carbon electrode 110. The perovskite layer 120 is an active layer for converting incoming solar radiation into pairs of holes and electrons. Part of the holes and the electrons are recombined in the perovskite layer 120. The function of the optional interface layer 115 is to help reducing charge recombination. The carbon electrode 110 and the FTO transparent conductive layer 150 are used to collect the remaining holes and the remaining electrons, respectively. For the PSC 100, a partially-completed PSC 102 as defined above is a structure consisting of the glass substrate 160, the FTO transparent conductive layer 150, the compact $TiO_2$ layer 140, the mesoporous $TiO_2$ layer 130, the perovskite layer 120, and optionally the interface layer 115.

Figure 2:
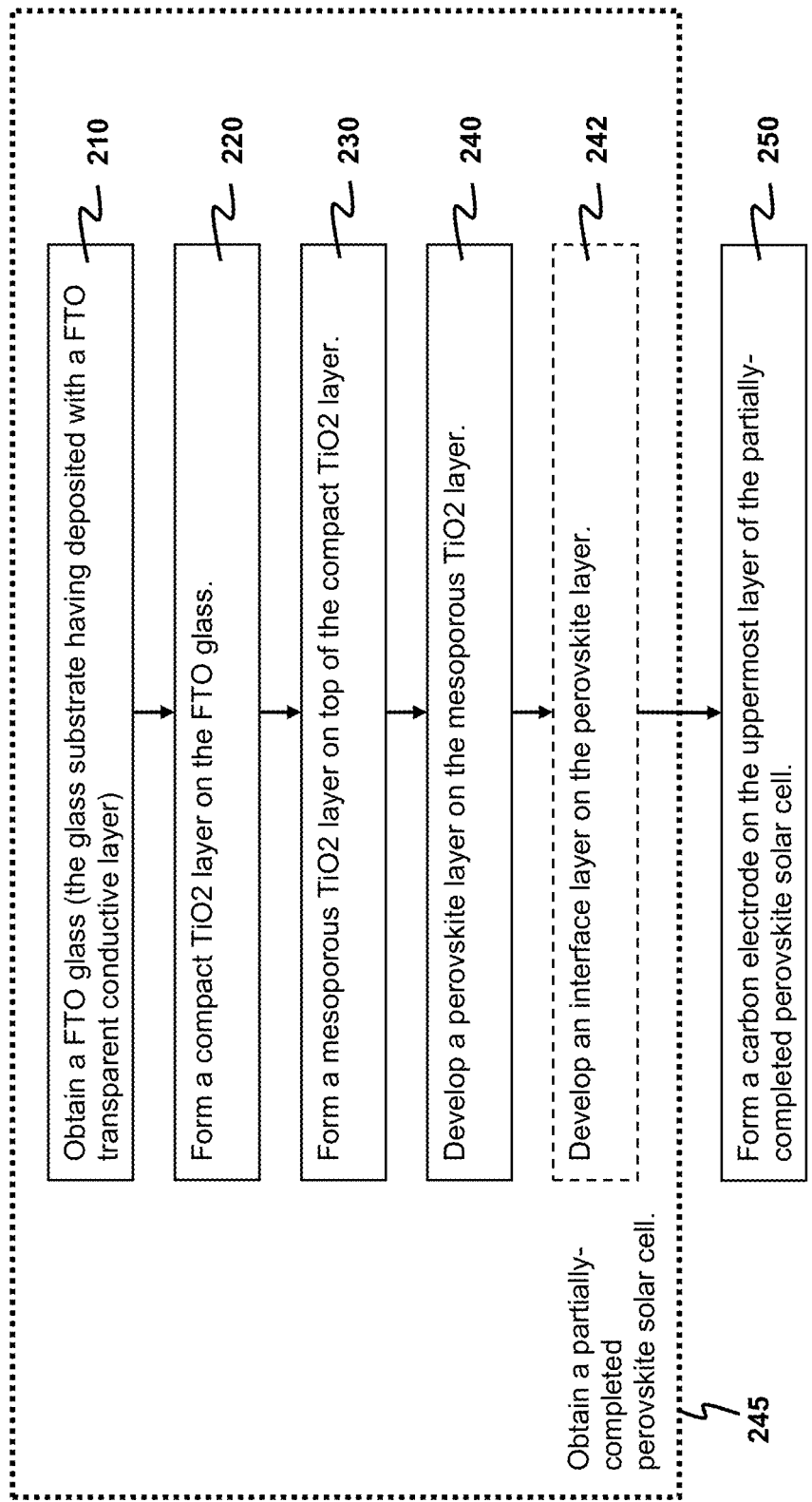
FIG. 2 depicts a flowchart of fabricating a PSC in accordance with one embodiment of the present invention.

FIG. 2 depicts a flowchart of fabricating the PSC 100 according to one embodiment of the present invention. The partially-completed PSC 102 is obtained in a step 245. The perovskite layer 120 of the partially-completed PSC 102 has one surface uncovered such that this surface is to be deposited with the carbon electrode 110 in a step 250. In obtaining the partially-completed PSC 102, the step 245 comprises a first step 210 of obtaining a FTO glass 165 (namely, the glass substrate 160 deposited with the FTO transparent conductive layer 150), a second step 220 of forming the compact $TiO_2$ layer 140 on the FTO glass 165, a third step 230 of forming the mesoporous $TiO_2$ layer 130 on the compact $TiO_2$ layer 140, a fourth step 240 of developing the perovskite layer 120 on the mesoporous $TiO_2$ layer 130, and an optional fifth step 242 of forming the interface layer 115 onto the perovskite layer 120.

A. Fabrication of the Partially-Completed PSC 102

As mentioned above, the method for forming the carbon electrode as disclosed in the present invention is applied to a partially-completed PSC without any limitation on its structure except that the partially-completed PSC has an uppermost layer that is either a perovskite layer or an interface layer on the perovskite layer. Embodiments that follow for the steps 220, 230, 240 and 242 are provided merely for showing one practical realization of the partially-completed PSC on which the carbon electrode may be deposited by the disclosed method.

A.1. Fabrication of $TiO_2$ Layer (Step 220)

The compact $TiO_2$ layer 140 can be fabricated via a sol-gel spin coating method. The sol-gel metal oxide precursor solution is prepared and aged before spin coating. The aging of the solution may last for at least 2 hours. Before coating the metal oxide $TiO_2$, the cleaned FTO glass 165 should be treated with $O_2$ plasma for further surface cleaning and surface energy modification. The treatment time can last for from 1 minute to 60 minutes. Then the aged solution is coated onto the FTO glass 165 using spin coating. The spin speed is in the range of 500 rpm to 6000 rpm, lasting for a period of 10 s to 60 s. After spin coating, the wet film is baked on a hotplate or an oven. The baking temperature is in the range of 30° C. to 150° C. The baking time lasts for 1 minute to 100 minutes. In order to obtain a dense metal oxide layer of $TiO_2$, the FTO glass 165 is then calcined at a temperature in the range of 100° C. to 500° C. The calcination time lasts for 30 minutes to 100 minutes.

A.2. Fabrication of Mesoporous $TiO_2$ Layer (Step 230)

To deposit the mesoporous $TiO_2$ layer 130, metal oxide paste containing $TiO_2$ and diluted by ethanol is spin-coated onto the compact $TiO_2$ layer 140 at a spin speed in the range of 500 rpm to 6000 rpm. The wet film is then annealed at a temperature in the range of 100° C. to 500° C. for a time in the range of 30 minutes to 100 minutes. The total thickness of the compact $TiO_2$ layer 140 and the mesoporous $TiO_2$ layer 130 as obtained ranges from 50 nm to 500 nm. Both the compact $TiO_2$ layer 140 and the mesoporous $TiO_2$ layer 130 are highly transparent to ensure transmission of light to the perovskite layer 120.

A.3. Fabrication of Perovskite Layer (Step 240)

The perovskite layer 120 that is typically used for solar-cell applications has a structure of $ABX_3$, where: A is $CH_3NH_3^+$; B is selected from $Pd^{2+}$, $Cd^{2+}$, $Ge^{2+}$, $Sn^{2+}$, $Pb^{2+}$, $Eu^{2+}$ and $Yb^{2+}$; and X is selected from $Cl^-$, $Br^-$ and $I^-$.

In one embodiment, a two-step spin coating method is used to fabricate the perovskite layer 120. This method has good process controllability. Firstly, $PbI_2$ is dissolved in N-Dimethylformamide heated at a temperature above the room temperature for an overnight. The heating temperature is in a range of 10° C. to 70° C. Also, Methylammonium iodide (MAI) is dissolved in Isopropyl alcohol (IPA) before coating. The first spin-coating step 1 s to spin coat the $PbI_2$ solution onto the mesoporous $TiO_2$ layer 130 in a glove box. The spin speed is in the range of 500 rpm to 6000 rpm, and the spin lasts for 10 s to 60 s. After spinning, the substrate (namely, a stack of the mesoporous $TiO_2$ layer 130, the compact $TiO_2$ layer 140 and the FTO glass 165) is placed at room temperature for natural drying. The drying time can last for 10 minutes to 100 minutes. The substrate is then baked at a temperature in the range of 10° C. to 100° C. Before the substrate is coated with the MAI solution, the baking time is in the range of 1 minute to 20 minutes. During baking, with the solvent evaporated, the $PbI_2$ layer turns to be clearly light yellow. The MAI solution is then dripped directly onto the hot substrate and reacts with $PbI_2$. With the reaction going on, the color of the film changes from light yellow to dark brown. The reaction may last for a time in the range of 1 s to 60 s. After the reaction, the second spin-coating step is performed, in which the substrate is spun to form a compact perovskite film. The spin speed is in the range of 500 rpm to 6000 rpm, and the spin lasts for 10 s to 60 s. After spinning, the substrate is rinsed with IPA to remove the unreacted MAI. The wet substrate is then baked at a temperature in the range of 30° C. to 100° C., and the baking may last for 10 minutes to 100 minutes. The perovskite layer 120 is then formed. After formation of the perovskite layer 120, an interface layer may be deposited on top of the perovskite layer 120 to assist charge transfer.

In another embodiment, the second spin-coating step is be performed for simplifying the manufacture of the perovskite layer 120, so that the perovskite layer 120 is fabricated by a one-step spin-coating process.

In large-scale production, spray coating or dip coating may be used instead of spin coating.

A.4. Fabrication of Interface Layer (Optional Step 242)

The insert of poly(3-hexylthiophene-2,5-diyl) (P3HT) between the perovskite layer 120 and the carbon electrode 110 to form the interface layer 115 can further enhance the PCE because the P3HT layer can act as an electron blocker to thereby help reducing charge recombination.

P3HT is a regioregular semiconducting polymer. It is used in organic electronics primarily because of its regular end-to-end arrangement of side chain, which allows efficient 7C-7C stacking of conjugated backbones. On account of the alkyl side group, P3HT is rendered hydrophobic in neutral state. Therefore, the interface layer 115 formed by P3HT is a hydrophobic polymer binder having an advantage of connecting the carbon electrode 110 and the perovskite layer 120, thus greatly stabilizing the PSC 100.

The interface layer 115 is formed by spin-coating a layer of P3HT on the perovskite layer 120 with a concentration ranging from 10 mg/ml to 20 mg/ml.

B. Fabrication of Carbon Electrode on Partially-Completed PSC (Step 250)

To push up the PCE of the PSC 100, it is desirable to have the carbon electrode 110 that enables the PSC 100 to yield an open-circuit voltage as high as possible and a short-circuit current also as high as possible. The disclosed method of forming the carbon electrode 110 has an advantage of achieving a high open-circuit voltage while the short-circuit current is enhanced by reducing a sheet resistance of the formed carbon electrode 110. In particular, the Inventors have found that applying a pressure during forming the carbon electrode 110 can reduce its sheet resistance.

Figure 3:
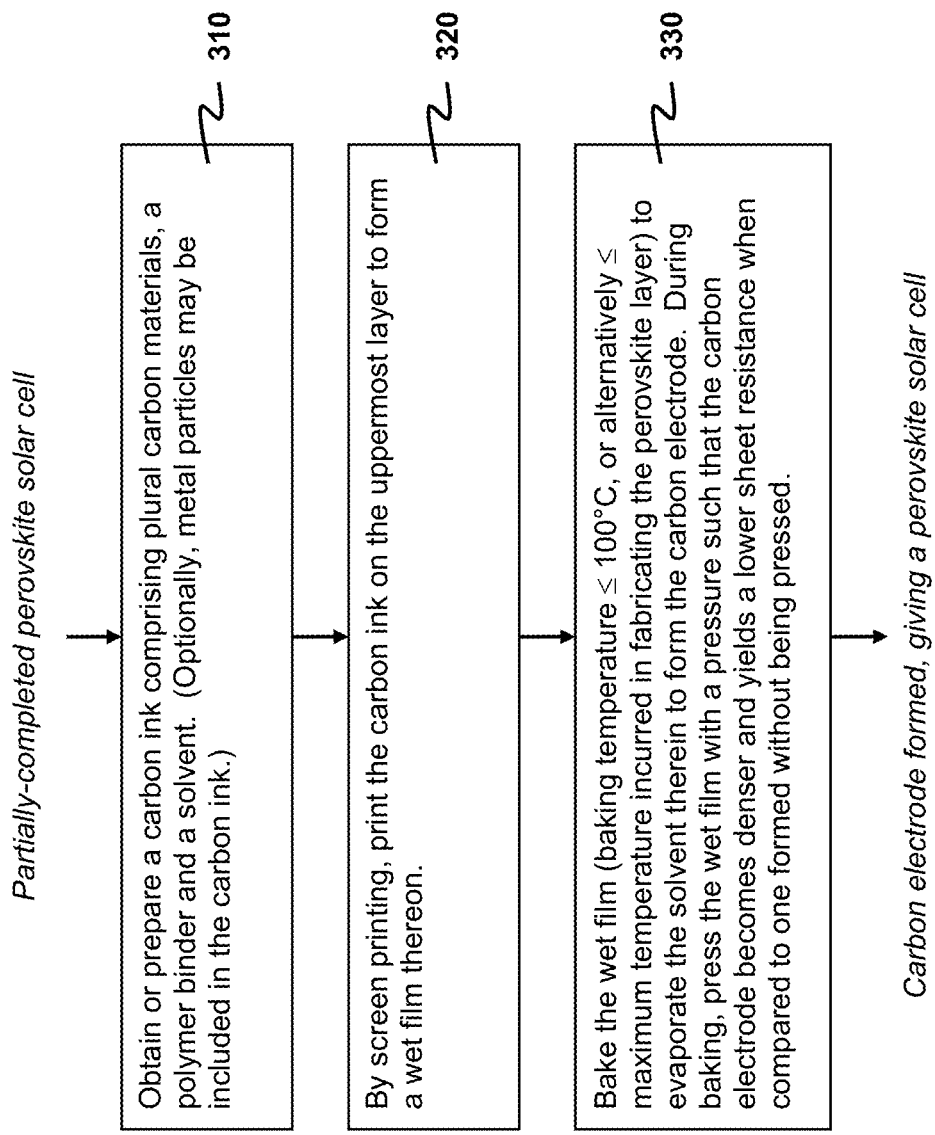
FIG. 3 depicts a flowchart for illustrating the fabrication of a carbon electrode on an uppermost layer of a partially-completed PSC in accordance with an exemplary embodiment of the present invention, where the uppermost layer is either a perovskite layer or an interface layer deposited thereon.

The carbon electrode 110 is formed by first obtaining or preparing a carbon ink and then printing the prepared carbon ink on the uppermost layer of the partially-completed PSC 102, followed by baking in the presence of pressure. The process of forming the carbon electrode 110 (the step 250) is exemplarily detailed as follows with the aid of FIG. 3, which depicts a flowchart illustrating representative steps taken in fabricating the carbon electrode 110.

In a first step 310 of the process, a conductive carbon ink is obtained or prepared, where the carbon ink comprises plural carbon materials, a polymer binder and a solvent. The carbon materials are dispersed in a mixture of the polymer binder and the solvent. The polymer binder is used for connecting the carbon materials together to form the ink.

The carbon materials are used as electrically-conductive media in forming the carbon electrode 110. To achieve good conductance and to reduce the material cost, one or more of the carbon materials having good conductivity are collectively regarded as a host material, and remaining one or more of the carbon materials are used as a filler for material cost reduction. In one choice that achieves a good balance between good conductance and low material cost, graphite is used as the host material and carbon black is used as the filler. Other carbon materials, such as graphene, carbon fibers and carbon nanotubes, may also be used as the host material to further reduce the sheet resistance of the resultant carbon electrode 110. The weight ratio of the carbon host to the filler may be selected from 1 to 10. The particle size of carbon black is preferred to be in the range of 2 nm to 200 nm. The weight ratio of the total carbon material in the ink is also preferred to be in the range of 10% to 90%. Non-conjugated polymer, such as polyurethane, ethyl cellulose, polyamide and polyvinyl butyral, is preferably used as a binder to connect the carbon materials together to form the conductive carbon ink. Conjugated polymer may also be used as the binder. The weight ratio of the polymer binder in the ink is preferred to be in the range of 10% to 40%. To control drying of printed carbon films that eventually form the carbon electrode 110, one may use a solvent formed by mixing plural component solvents having different boiling points. The component solvents may include, but are not limited to, DBE-4 dibasic ester, DBE-5 dibasic ester and DBE-6 dibasic ester. The solvent is also helpful to disperse the carbon materials in forming the carbon ink.

In one embodiment, carbon materials including carbon host graphite flake and carbon filler super p, carbon nanofibers and carbon nanotubes are mixed, generally in different weight ratios, as well as milled in an agate mortar to form the carbon ink. The milling process may last for 1 minute to 60 minutes. After milling, the carbon materials are dispersed with polyurethane, ethyl cellulose, polyamide and polyvinyl butyral (diluted by dibasic ester solutions, with a concentration of 0.001 g/mL to 1 g/mL), followed by mixing in a condition mixer to form a well-dispersed carbon ink, which appears in a form of paste. The mixing may last for 1 minute to 60 minutes.

To further reduce the sheet resistance of the carbon electrode 110, optionally, the carbon ink further comprises metal particles dispersed in the mixture of the polymer binder and the solvent. Examples of such metal particles include particles of gold, silver, platinum, nickel, or a combination thereof. These metal particles may have an average diameter of less than 500 nm as disclosed in US2013/0209807.

The carbon ink is used to form the carbon electrode 110 in a second step 320. To form the carbon electrode 110, the prepared carbon ink is screen-printed onto the uppermost layer of the partially-completed PSC 102. A wet film is thereby formed on the uppermost layer. Depending on the sheet resistance that is required, the wet film is usually formed with a thickness ranging from 1 µm to 500 µm. In general, the carbon electrode 110 that is formed by the method disclosed herein has a sheet resistance from 1 to 100 ohms per square.

After the wet film is formed, the wet film is baked to remove the solvent to form the carbon electrode 110 in a third step 330. Baking the wet film also performs an annealing to different layers of the PSC 100, especially the perovskite layer 120, and the interface layer 115 if present. The baking temperature (or the annealing temperature) is preferably maintained to be at most 100° C. Although a baking temperature higher than 100° C. may be used, such higher baking temperature may cause degradation to the perovskite layer 120 and reduce the PCE of the PSC 100. The baking temperature may be selected from 30° C. to 100° C., preferably from 50° C. to 100° C., more preferably 70° C. to 100° C., and even more preferably from 90° C. to 100° C. As will be shown in Section C.2, a baking temperature closer to 100° C. gives a smaller sheet resistance. For a baking temperature in the range of 30° C. to 100° C., the baking time may last for 1 minute to 60 minutes. Different baking temperatures require different baking times to get rid of residual solvent.

Instead of mandating a guideline of setting the baking temperature to be at most 100° C., those skilled in the art may select the baking temperature used in baking the wet film to be not greater than a maximum temperature incurred in fabricating the perovskite layer 120 in the step 240. Usually such baking temperature prevents the perovskite layer 120 from being exposed to a temperature higher than the aforesaid maximum temperature. In the embodiment detailed in Section A.3, this maximum temperature is 100° C.

In the step 330, a hot press treatment to the wet film during the course of baking is advantageously used. By pressing, the film becomes denser and the sheet resistance of the resultant carbon electrode 110 is lowered. The hot press treatment may be implemented by using a mechanical press to mechanically exert the pressure on the wet film deposited on the partially-completed PSC 102.

Note that achieving a lower sheet resistance is contrary to an expectation of those skilled in the art, as explained as follows. For a rectangular-shaped resistor having a length L and a cross-sectional area A, its resistance, R, is given by $R = \rho L/A$ where $\rho$ is the resistivity. Written the cross-sectional area as $A = W \times t$ where W is the width and t is the thickness, one gets $R = R_s \times L/W$ where $R_s = \rho/t$ is the sheet resistance. Those skilled in the art would first notice that logically the application of a downward pressure to the resistor only changes t without affecting L and W. Since the amount of conductive materials in the resistor is unchanged due to the pressure, and since the distribution of conductive materials is affected by the pressure only along the direction of thickness, those skilled in the art would expect that R would remain unchanged before and after the pressure is applied. As the exertion of the pressure does not affect L and W, those skilled in the art would also expect that $R_s$ would not change before and after application of the pressure. On the contrary, the Inventors have found an unexpected result that the sheet resistance is reduced after the pressure is applied, as experimentally demonstrated in Section C.2.

Preferably, a pressure of at least 16,000 Pa is applied to the wet film during baking. It is also preferable to set the pressure to be in the range of 16,000 Pa to 1,600,000 Pa. This range of pressure may be further narrowed down to 160,000 Pa to 1,600,000 Pa. Baking the wet film to dryness in the presence of such pressure yields a reduction of sheet resistance of the resultant carbon electrode 110 when compared to an electrode formed during baking without being applied with the pressure.

C. Experimental Results

The advantage of pushing up the PCE by using the carbon electrode 110 as disclosed herein in the PSC 100 is demonstrated by a two-step approach. First, experimental results for the PSC 100 having the carbon electrode 110 formed without being exerted with a pressure during baking are presented to demonstrate the achievement of a high open-circuit voltage. Second, comparison of experimental results for solar cells with and without addition of pressure in forming carbon electrodes are made for demonstrating that the short-circuit current is further promoted by a reduction of sheet resistance.

C.1. Experimental Results for Samples without Treated with the Hot Press Treatment The solar cell samples for experimental investigation were fabricated according to the following details.

For an individual solar cell sample, first a layer of compact $TiO_2$ thin film was spin-coated on a FTO glass as the electron transporting layer. A mesoporous $TiO_2$ scaffold layer was then spin-coated onto the compact $TiO_2$ layer. Thereafter, a layer of $PbI_2$ film having a thickness of about 300 nm was spin-coated on the mesoporous $TiO_2$ layer. Then $CH_3NH_3I$ was spin-coated on the $PbI_2$ layer and reacted with $PbI_2$ to form a perovskite layer ($CH_3NH_3PbI_3$). It was followed by a post-annealing at a temperature of about 100° C. for 30 minutes.

Multiple solar cell samples were made, in these samples, three types of carbon electrodes (A, B and C) were fabricated by using different carbon hosts. The carbon electrode with graphite (10~13 µm, purchased from Xieli Graphite) and carbon filler at a weight ratio of 3:1 is regarded as carbon film A. In order to investigate if the carbon electrode prepared by using smaller graphite particles could make a better contact, the carbon film B by using graphite with particle size 8~10 µm (purchased from Eno Material) and carbon film C by using graphite with particle size 8~10 µm (purchased from XiangYang Graphite) were also prepared.

Figure 4:
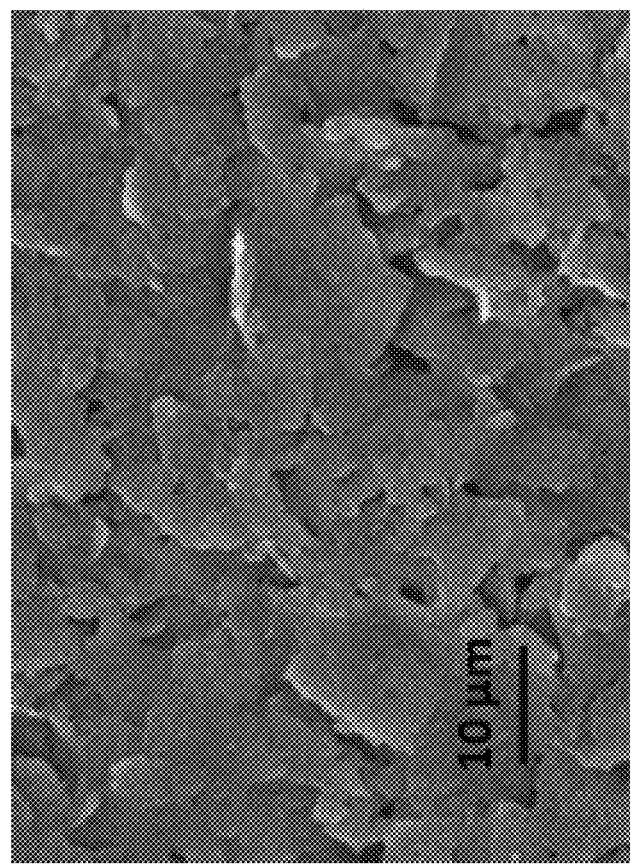
FIG. 4 shows a SEM image of a carbon electrode (carbon film C) consisting of graphite flake, carbon black and polyurethane.

From scanning electron microscope (SEM) imaging, it was found that the carbon film C was the most superior among the three carbon films, as demonstrated in FIG. 4, which shows a SEM image of the carbon film C. FIG. 4 indicates that the graphite, carbon filler and the binder were homogeneously dispersed. Therefore, the carbon film C exhibited a compact and smooth morphology, enabling it to function well as a counter electrode in the disclosed PSC.

TABLE 1

| Solar cell: | $J_{sc}$ (mA cm$^{-2}$) | $V_{oc}$ (V) | FF (%) | PCE (%) |
|---|---|---|---|---|
| With carbon film A | 15.169 | 1.015 | 54.9 | 8.5 |
| With carbon film B | 17.629 | 0.984 | 51.9 | 9.0 |

TABLE 1-continued

| Solar cell: | $J_{sc}$ (mA cm$^{-2}$) | $V_{oc}$ (V) | FF (%) | PCE (%) |
|---|---|---|---|---|
| With carbon film C | 16.650 | 1.017 | 50.5 | 8.6 |
| Commercial | 18.497 | 0.916 | 45.0 | 7.6 |

Table 1 lists values of short-circuit current ($J_{sc}$), open-circuit voltage ($V_{oc}$), fill factor (FF) and PCE for solar cell samples with different carbon films (A, B and C) and a commercial solar cell sample. It is apparent that solar cell samples formed with disclosed carbon films all have high open-circuit voltages around 1V, which is an extremely high open-circuit voltage in PSCs and comparable to PSCs using noble metal electrodes. As is mentioned above, a high $V_{oc}$ gives a high PCE. The results demonstrate an advantage of the disclosed solar cell in providing a high PCE.

TABLE 2

| Carbon Film | Sheet resistance (Ω/sq.) |
|---|---|
| D | 17 |
| E | 20 |
| F | 14 |
| G | 20 |
| H | 9 |
| I | 45 |
| J | 33 |

Table 2 lists sheet resistance values of carbon films (D-J) manufactured according to the disclosed method where each of the carbon films has a thickness of 30 μm. It is apparent that the carbon film H, which utilizes larger graphite in forming the film, has a sheet resistance of only 9 ohms per square. It demonstrates an advantage that the sheet resistance of carbon films manufactured according to the disclosed method can be as low as a few ohms per square.

C.2. Experimental Results for Samples with and without Hot Press Treatment

TABLE 3

| Sample | Temperature (° C.) | Baking time (h) | Sheet resistance (Ω/square) Without pressure | Sheet resistance (Ω/square) With pressure | % reduction of sheet resistance |
|---|---|---|---|---|---|
| 1 | 100 | 1 | 20 | 12 | 40% |
| 2 | 80 | 4 | 23 | 13 | 43% |
| 3 | 60 | 16 | 23 | 15 | 35% |
| 4 | Room temperature | 48 | 28 | 20 | 29% |

Four carbon film samples were screen-printed on the glass substrate to investigate the effect of hot pressing with different temperature. For hot pressing with a higher temperature, the baking time should be increased. If the room temperature is used, the baking time can even be as long as 48 h. This is not good for the perovskite film to contact with the solvent in the carbon electrode film. The faster the evaporation of the solvent is, the better quality of the perovskite film is.

Table 3 lists sheet resistance values for carbon films with and without the hot press treatment. In the presence of pressing, a pressure of 160,000 Pa was used. It is apparent that a significant percentage reduction of sheet resistance is obtained for each samples with different baking temperatures. A percentage reduction as high as 40% is achievable.

TABLE 4

| Carbon Film | $J_{sc}$ (mA cm$^{-2}$) | $V_{oc}$ (V) | FF (%) | PCE (%) |
|---|---|---|---|---|
| C (without hot press treatment) | 16.650 | 1.017 | 50.5 | 8.6 |
| C (with hot press treatment) | 18.497 | 1.006 | 51.0 | 9.2 |

Table 4 compares the PCE values for samples of the carbon film C fabricated with and without the hot press treatment. In the presence of hot press treatment, the carbon film C was treated with a temperature of 100° C. for 1 hour at a pressure of 160,000 Pa. In the absence of hot press treatment, the carbon film C was prepared by evaporating the solvent therein at room temperature without pressing. As expected, the short-circuit current is increased when the hot press treatment is used in fabricating the film. Also, the PCE is increased, further pushing up the PCE when compared to commercial PSCs.

D. Summary of Advantages, and Remarks

A summary of advantages offered by the resultant solar cell is provided as follows.
- In comparison with certain metal electrodes (e.g., Ag), the carbon electrode helps to achieve a better device stability.
- The solar cell with a printed carbon electrode as disclosed herein can achieve a voltage higher than 1.0V, thereby helping the solar cell to achieve a high PCE.
- The printed carbon electrode can achieve a low sheet resistance comparable or lower than that of metal oxide electrode. It is also helpful to achieve a high PCE for the solar cell.
- The cost of raw materials of carbon ink is low. Hence, the overall material cost of manufacturing the solar cell is reduced.
- Compared to a traditional metal electrode, the carbon electrode can be fabricated by using a solution process. Hence, the requirement on fabrication equipment can be reduced.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A method for fabricating a perovskite solar cell (PSC) comprising:
    forming a carbon electrode on an uppermost layer of a partially-completed PSC, wherein the uppermost layer is either a perovskite layer or an interface layer deposited thereon;
    the forming of the carbon electrode comprising:
        obtaining a carbon ink comprising plural carbon materials, a polymer binder and a solvent, wherein the carbon materials are dispersed in a mixture of the polymer binder and the solvent, and wherein the polymer binder is used for connecting the carbon materials together to from the carbon ink;
        screen-printing the carbon ink on the uppermost layer to form a wet film thereon; and baking the wet film with a baking temperature not greater than 100° C. to evaporate the solvent therein to thereby form the carbon electrode, wherein the wet film is pressed with a pressure during baking such that the carbon electrode that is formed becomes denser and yields a lower sheet resistance when compared to a second carbon electrode formed without being pressed.

2. The method of claim 1, wherein the pressure is at least 16,000 Pa.

3. The method of claim 1, wherein the pressure is in a range of 16,000 Pa to 1,600,000 Pa.

4. The method of claim 1, wherein the pressure is in a range of 160,000 Pa to 1,600,000 Pa.

5. The method of claim 1, wherein the baking temperature is in a range of 30° C. to 100° C.

6. The method of claim 1, wherein the carbon materials include one or more of graphite, graphene, carbon fibers and carbon nanotubes.

7. The method of claim 1, wherein the one of the carbon materials is carbon black, the carbon black being regarded as a filler while remaining one or more carbon materials are collectively regarded as a host material.

8. The method of claim 7, wherein the carbon black has a particle size in a range of 2 nm to 200 nm.

9. The method of claim 7, wherein a weight ratio of the host material to the filler is selected from 1 to 10.

10. The method of claim 1, wherein a total weight of the carbon materials in the ink is 10% to 90% of a weight of the ink.

11. The method of claim 1, wherein the solvent is formed by mixing plural component solvents having different boiling points.

12. The method of claim 11, wherein at least one of the component solvents is selected from DBE-4 dibasic ester, DBE-5 dibasic ester and DBE-6 dibasic ester.

13. The method of claim 1, wherein the polymer binder is composed of one or more of polyurethane, ethyl cellulose, polyamide and polyvinyl butyral.

14. The method of claim 1, wherein a weight ratio of the polymer binder in the ink is 10% to 40%.

15. The method of claim 1, wherein the carbon ink further comprises metal particles dispersed in the mixture.

16. The method of claim 1 further comprising:
forming the perovskite layer on a mesoporous $TiO_2$ layer of the partially-completed PSC, wherein the perovskite layer is formed by a one-step or two-step spin-coating process.

17. The method of claim 1 further comprising:
forming the perovskite layer on a mesoporous $TiO_2$ layer of the partially-completed PSC, wherein the perovskite layer is formed via spray coating or dip coating.

18. A method for fabricating a perovskite solar cell (PSC) comprising:
forming a carbon electrode on an uppermost layer of a partially-completed PSC, wherein the uppermost layer is either a perovskite layer or an interface layer deposited thereon;
the forming of the carbon electrode comprising:
obtaining a carbon ink comprising plural carbon materials, a polymer binder and a solvent, wherein the carbon materials are dispersed in a mixture of the polymer binder and the solvent, and wherein the polymer binder is used for connecting the carbon materials together to from the carbon ink;
screen-printing the carbon ink on the uppermost layer to form a wet film thereon; and
baking the wet film to evaporate the solvent therein to thereby form the carbon electrode, wherein a baking temperature used in baking the wet film is not greater than a maximum temperature incurred in fabricating the perovskite layer, and wherein the wet film is pressed with a pressure during baking such that the carbon electrode that is formed becomes denser and yields a lower sheet resistance when compared to a second carbon electrode formed without being pressed.

19. The method of claim 18, wherein the pressure is at least 16,000 Pa.

20. The method of claim 18, wherein the pressure is in a range of 16,000 Pa to 1,600,000 Pa.

* * * * *